United States Patent [19]

Horne et al.

[11] Patent Number: 4,690,286

[45] Date of Patent: Sep. 1, 1987

[54] ENCLOSURE FOR HOUSING CIRCUIT BOARDS

[75] Inventors: David Horne, Winchester; Laurence Parker, West Wellow, both of England

[73] Assignee: BICC Public Limited Company, London, England

[21] Appl. No.: 907,972

[22] Filed: Sep. 16, 1986

[30] Foreign Application Priority Data

Sep. 19, 1985 [GB] United Kingdom ............... 8523161

[51] Int. Cl.⁴ .............................................. H05K 5/00
[52] U.S. Cl. ....................................... 211/41; 211/26; 361/390; 361/415
[58] Field of Search ................ 361/415, 390, 391; 211/41, 26

[56] References Cited

U.S. PATENT DOCUMENTS

3,656,058  4/1972  Leathers ........................ 361/390 X
4,232,356 11/1980  Saunders et al. .................. 211/41 X
4,287,764  9/1981  Staab et al. ..................... 361/415 X Primary Examiner—Robert W. Gibson, Jr.
Attorney, Agent, or Firm—Parkhurst & Oliff

[57] ABSTRACT

An enclosure for housing sub-racks carrying circuit boards and modules carrying other electricalcomponents comprises two separately formed identical bodies, each of which constitutes an end wall and a part of each of a pair of oppositely disposed side walls and which are secured together to form an enclosure having two oppositely disposed open faces. Adjacent one of the open faces of the enclosure, means is provided on which sub-racks and modules can be detachably mounted in the enclosure either with the front faces of the sub-racks and modules flush with the open face of the enclosure or with the faces of the sub-racks and modules set back from the open face. Preferably, inner parts of the end walls of the bodies adjacent the other open face of the enclosure are so shaped that sub-racks and modules can be trapped in the enclosure between the inner parts of the end walls when the enclosure is assembled.

17 Claims, 17 Drawing Figures

ENCLOSURE FOR HOUSING CIRCUIT BOARDS

This invention relates to an enclosure for housing circuit boards.

It is an object of the invention to provide, for housing sub-racks or card frames carrying circuit boards and/or modules carrying other electrical components, an improved enclosure which is simple in form and inexpensive to manufacture.

According to the invention, the improved enclosure comprises two separately formed substantially identical bodies, each of which constitutes an end wall and a part of each of a pair of oppositely disposed side walls and which are detachably secured together to form an enclosure having two oppositely disposed open faces, wherein adjacent one of said two oppositely disposed open faces of the enclosure, the enclosure includes means on which sub-racks or card frames and/or modules can be detachably mounted in the enclosure either with front faces of the sub-racks or card frames and/or modules substantially flush with said open face of the enclosure or with said faces of the sub-racks or card frames and/or modules set back from said open face of the enclosure.

Preferably, inner parts of the end walls of said bodies adjacent the other of said oppositely disposed open faces are so shaped that sub-racks or card frames and/or modules can be trapped in the enclosure between said inner parts of said end walls of the bodies when the enclosure is assembled. In this case, two or more sub-racks or card frames and/or modules can be mounted one on top of the other or another and be trapped between said inner parts of said end walls of the bodies. Said inner parts of the end walls of said bodies preferably define slots or blind apertures in which flanges or other parts of sub-racks or card frames and/or modules can engage.

The means on which sub-racks or card frames and/or modules can be detachably mounted in the enclosure preferably comprise a pair of pillars which detachably engage in slots or blind apertures in inner parts of the end walls of the bodies and which are trapped therebetween, each of which pillars has throughout substantially the whole of its length a flange which has a plurality of apertures mutually spaced throughout its length and which lies to one side of a plane containing the central axis of the pillar, the flange of one pillar extending towards and lying in substantially the same plane as the flange of the other pillar. Since the flange of each pillar lies to one side of a plane containing the central axis of the pillar, by inverting the pillar, the position of the apertured flange with respect to the adjacent open face of the enclosure can be selected so that sub-racks or card frames and/or modules can be detachably secured to the apertured flange of each pillar either with front faces of the sub-racks or card frames and/or modules substantially flush with said open face of the enclosure or with said faces of the sub-racks or card frames and/or modules set back from said open face of the enclosure.

It will be appreciated that in its preferred form the improved enclosure of the present invention provides alternative assembly facilities, in one of which sub-racks or card frames and/or modules are detachably mounted within the enclosure and so can be readily removed for servicing or testing and in the other of which sub-racks or card frames and/or modules are trapped between the end walls of the enclosure and cannot be removed without dismantling of the enclosure.

In order to increase the volume of the space bounded by, and hence the capacity of, the enclosure, each of said oppositely disposed side walls of the enclosure may have secured between the parts of said side walls integral with the bodies at least one separately formed infill, oppositely disposed infills of said oppositely disposed side walls being substantially identical the one with the other. Where each of said oppositely disposed side walls of the enclosure has two or more separately formed infills secured in alignment between the parts of said side wall integral with the bodies, all of the separately formed infills of said side wall may be substantially identical with one another or the separately formed infills of said side wall may be of two or more forms differing from one another. At least one infill of each oppositely disposed side wall may have in its outer surface an inset or depression of such a shape and form as to constitute a finger grip or handle for facilitating lifting and carrying of the enclosure.

Preferably, the bodies of the enclosure, and when present the infills, are of moulded plastics material and, in this case, preferably are each manufactured by an injection moulding technique such as a controlled internal pressure injection moulding process but, in some circumstances, the bodies of the enclosure, and when present the infills, may be made of precase metal or metal alloy.

The rear face of the enclosure, that is that open face of the enclosure not chosen to be the front face, preferably is closed by a separately formed plate of plastics material, metal or other suitable material trapped between or secured to the end and side walls of the enclosure. The separately formed plate preferably has a plurality of ventilation slots or other apertures.

Each body constituting an end wall and parts of said oppositely disposed side walls of the enclosure preferably has ventilation slots or other apertures in the end wall and, in a preferred embodiment, such ventilation slots are formed in at least one groove in the outer surface of the body. In practice, the or each groove having ventilation slots in the outer surface of that wall of the enclosure which will be uppermost when the enclosure is in use preferably is temporarily closed by a separately formed strip which fits in the groove and thereby reduces risk of any liquid that is spilt from entering the enclosure. Alternatively, the wall of the enclosure which will be uppermost may be moulded, precast or otherwise formed without ventilation slots, the body or infill of which said wall forms a part otherwise being identical to the other body or oppositely disposed infill. Where the length of the oppositely disposed side walls of the enclosure is increased by the incorporation of one or more than one infill, the infill or at least one of the infills may also have ventilation slots or other apertures and, preferably, in such a case, the ventilation slots in the infill are formed in at least one groove in the outer surface of the infill, which groove is a continuation of the groove in the outer surfaces of the bodies.

Separately formed feet, e.g. of moulded plastics material, may be detachably secured to one of the bodies so that, when the enclosure is supported on these feet, the other of the bodies will be uppermost. Alternatively, two separately formed feet may be detachably secured to each of the bodies so that, when the enclosure is supported on these feet, the end walls constituted by these bodies will be substantially vertically disposed. In all cases, all the feet may be of substantially the same height or the front pair of feet may be of greater height than the rear pair of feet.

The improved enclosure of the present invention is especially, but not exclusively, suitable for use in the 19 inch (482.6 mm) system to International Electrotechnical Commission (IEC) 297 and, in its preferred form, can be provided of any height, in increments of 1U, between 3U and 12U, where U=1.75 inches (44.45 mm).

The invention is further illustrated by a description, by way of example, of three preferred forms of enclosure for housing circuit boards with reference to the accompanying drawings, in which.

Figure 1:
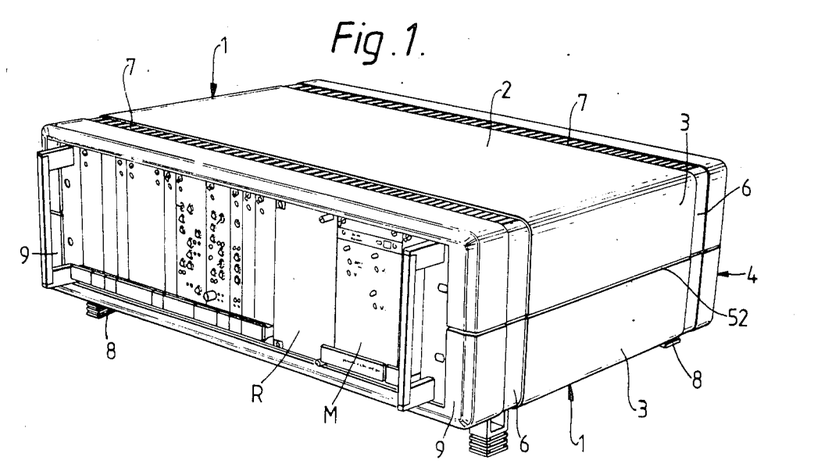
FIG. 1 is a front perspective view of a preferred enclosure, with sub-racks and modules detachably mounted therein, for use in the 19 inch system to IEC297 and having a height of 3U.
Figure 3:
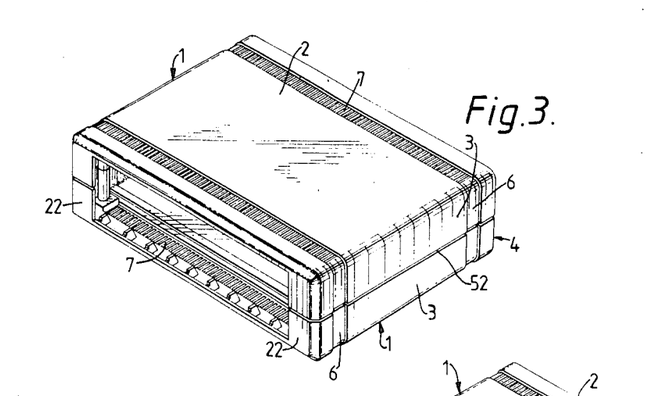
FIG. 3 is an isometric view of the enclosure shown in FIG. 1 with the sub-racks and modules omitted.

Referring to FIGS. 1 and 3, the enclosure for use in the 19 inch system to IEC297 and having a height of 3U comprises two separately formed identical bodies 1 of moulded plastics material, each of which constitutes an end wall 2 and a part 3 of each of a pair of oppositely disposed side walls 4 and which are detachably secured together to form the enclosure. As will be described in greater detail with reference to FIGS. 6 to 13, adjacent one of two oppositely disposed open faces of the enclosure, means is provided on which sub-racks R carrying circuit boards and modules M carrying other electrical components can be detachably mounted in the enclosure either, as shown, with front faces of the sub-racks or card frames and/or modules substantially flush with this open face or with the faces of the sub-racks or cardframes and/or modules set back from this open face so that any handles, switches or other fittings do not protrude to an undesirable extent. Each body 1 has in the outer surfaces of its end wall 2 and parts 3 two grooves 6, ventilation slots 7 being provided in that part of each groove in the outer surface of the end wall. Separately formed feet 8 of moulded plastics material are detachably secured to one of the bodies 1 so that, as shown in FIG. 1, when the enclosure is supported on these feet, the other body 1 will be uppermost. As will be seen, the front pair of feet are of greater height than the rear pair of feet. If desired, the ventilation slots 7 in the grooves 6 in the end wall 2 of the uppermost body 1 may be temporarily closed by separately formed strips (not shown) of plastics material which fit in the grooves and thereby reduce risk of any liquid that is split from entering the enclosure. The rear face of the enclosure is closed by a separately formed plate 10 (FIGS. 11 to 13) of plastics material which is trapped between the end walls 2 and parts 3 of the bodies 1 forming the enclosure.

Figure 2:
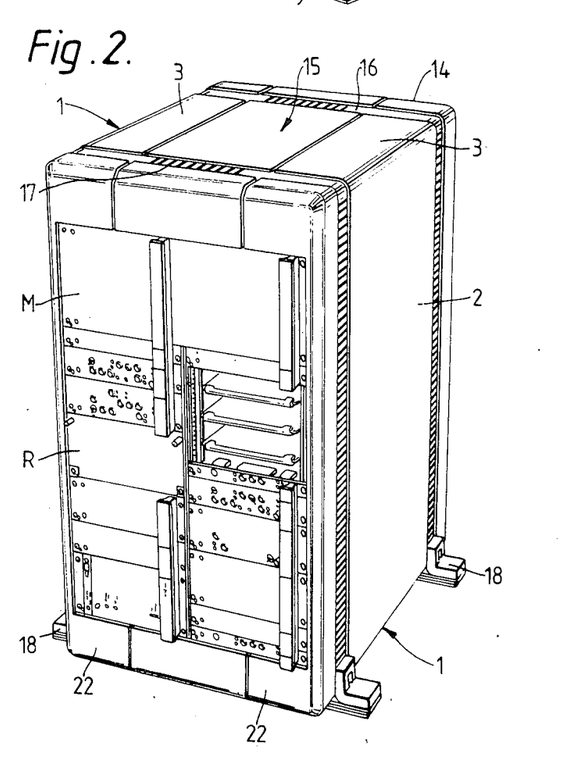
FIG. 2 is a front perspective view of a preferred enclosure, with sub-racks and modules trapped therein, for use in the same system but having an equivalent dimension of 6U.

The enclosure for use in the 19 inch system to IEC297 and having a height of 6U is shown in FIG. 2 and comprises two separately formed identical bodies 1 of moulded plastics material, each of which is identical to and whose parts are given the same references as, the plastics moulded bodies 1 of the enclosure shown in FIGS. 1 and 3. Each of the oppositely disposed side walls 14 of the enclosure has secured between the parts 3 of the bodies 1 a separately formed infill 15 of moulded plastics material, the infill of one side wall being identical to the infill of the other side wall. As will be described in greater detail with reference to FIGS. 6 to 17, the infills 15 interengage with the parts 3 of the bodies 1 and are clamped between the parts 3 when the enclosure is assembled. Each infill 15 has a pair of grooves 16 which are in alignment with the grooves 6 in the bodies 1 and, over a part of the length of each groove 16, ventilation slots 17 are formed. As will be described in greater detail with reference to FIGS. 6 to 13, inner parts of the end walls 2 of the bodies 1 are so shaped that sub-racks R and Modules M are mounted one on top of another and are trapped between the inner parts of the end walls so that they cannot be removed without dismantling the enclosure. Two separately formed feet 18 of moulded plastics material are detachably secured to each of the moulded plastics bodies 1, all the feet being of the same height, so that, when the enclosure is supported on these feet, the end walls 2 are vertically disposed and one of the side walls 14 incorporating an infill 15 is uppermost. That part of each groove 16 in the uppermost infill 15 in which ventilations slots 17 are formed may be temporarily closed by a separately formed strip (not shown) of plastics material which fits in the groove. As in the case of the enclosure shown in FIGS. 1 and 3, the rear face of the enclosure is closed by a separately formed plate 10 (FIGS. 11 to 13) of plastics material which is trapped between the end walls 2 and parts 3 of the bodies 1 forming the enclosure.

Figures 4, 5:
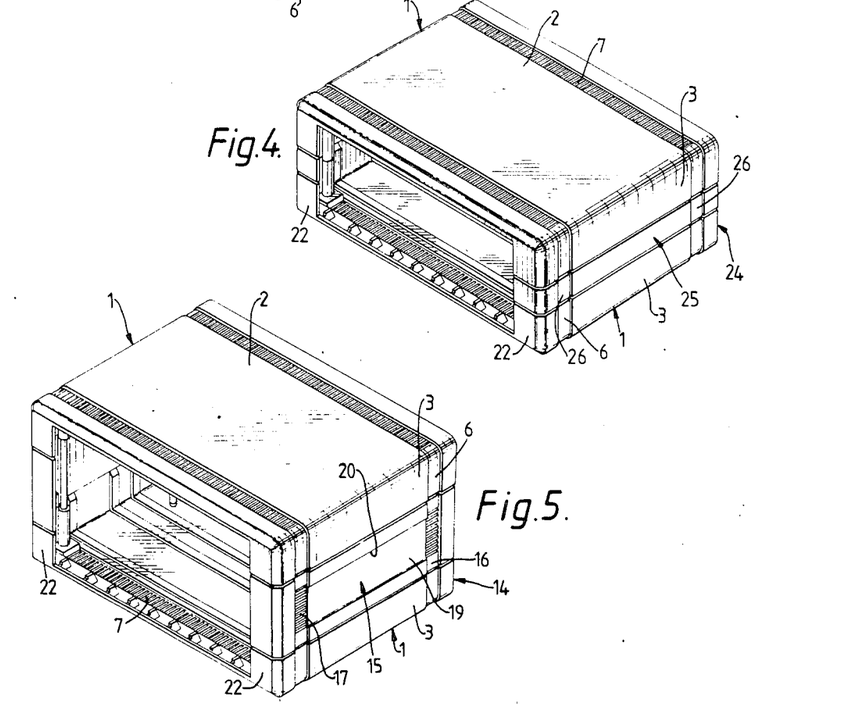
FIG. 4 is an isometric view of a preferred enclosure for use in the 19 inch system to IEC 297 and having a height of 4U.
FIG. 5 is an isometric view of a modified form of the enclosure shown in FIG. 2 with the sub-racks and modules omitted.
Figure 6:
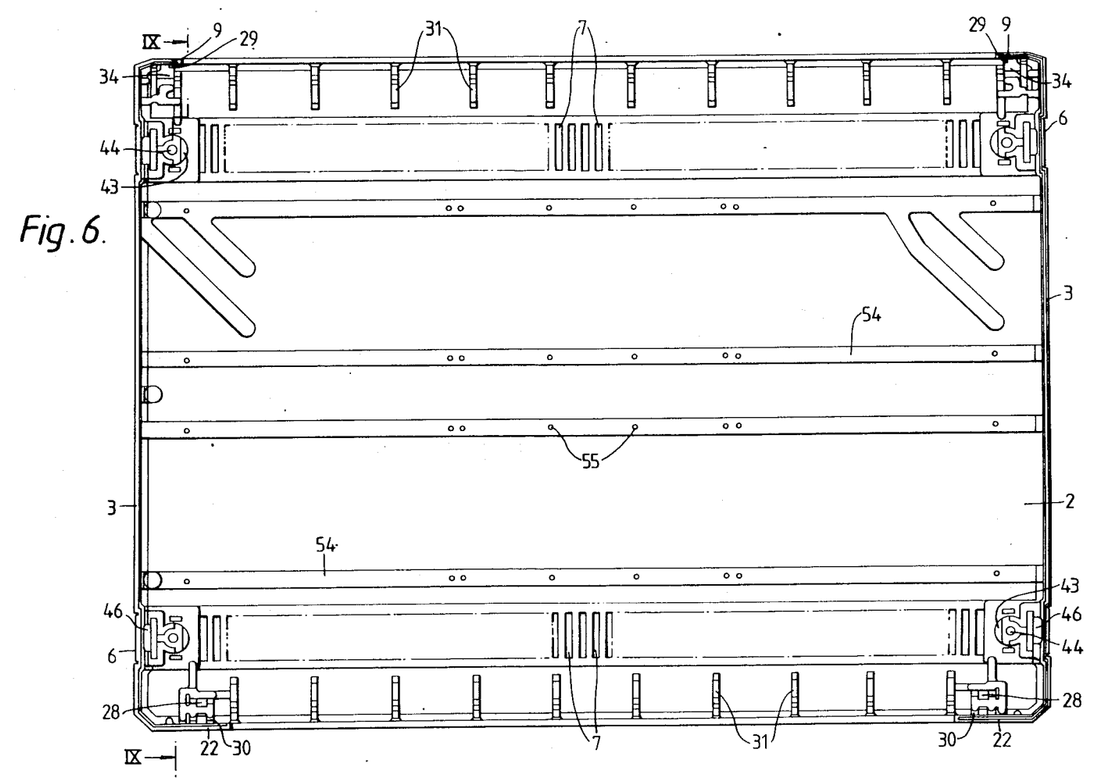
FIG. 6 is an inside plan view of one of the separately formed bodies of the enclosures shown in FIGS. 1 to 5.
Figure 7:
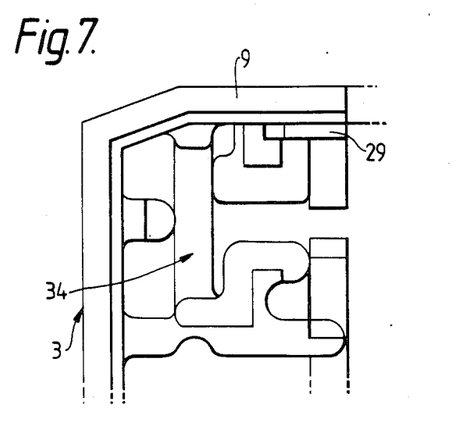
FIG. 7 is a fragmental inside plan view, drawn on an enlarged scale, of detail of one of the separately formed bodies adjacent one open face of the enclosures shown in FIGS. 1 to 5.
Figure 8:
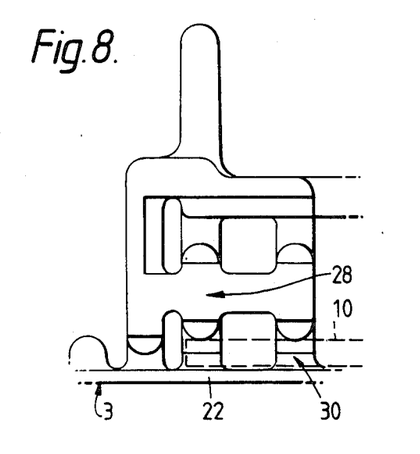
FIG. 8 is a fragmental inside plan view, drawn on an enlarged scale, of detail of one of the separately formed bodies adjacent the other open face of the enclosures shown in FIGS. 1 to 5.
Figure 9:
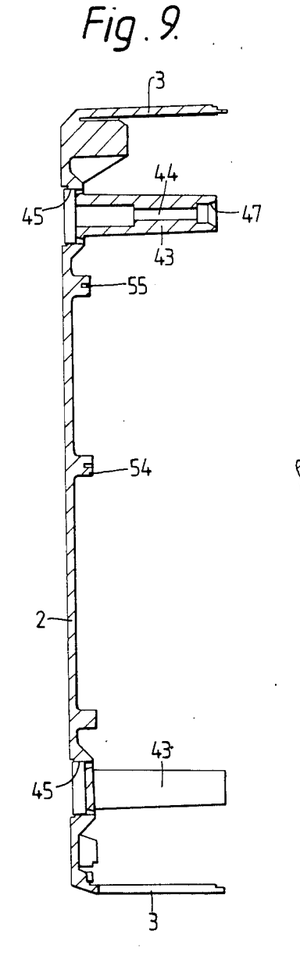
FIG. 9 is a sectional side view taken on the line IX—IX in FIG. 6.

FIG. 4 is an isometric view of the enclosure for use in the 19 inch system to IEC297 and having a height of 4U. The enclosure comprises two separately formed identical bodies 1 of moulded plastics material, each of which is identical to, and whose parts are given the same references as, the plastics moulded bodies 1 of the enclosure shown in FIGS. 1 and 3. Each of the oppositely disposed side walls 24 of the enclosure has secured between the parts 3 of the bodies 1 a separately formed infill 25 of moulded plastics material, the infill of one side wall being identical to the infill of the other side wall. The infills 25 interengage with the parts 3 of the bodies 1 and are clamped between the parts 3 when the enclosure is assembled in exactly the same manner as the infills 15 of the enclosure shown in FIG. 2 interengage with the parts 3 of the bodies 1, which manner will be described in greater detail with reference to FIGS. 6 to 17.

The enclosure shown in FIG. 5 is a modification of the enclosure shown in FIG. 2, differing in that, in use, one of the end walls 2 is uppermost and in that each of the infills 15 has in its outer surface an inset 19 extending between the grooves 16 and providing a shoulder 20 constituting a finger grip by means of which the enclosure can be lifted and carried.

As will be seen on referring to FIGS. 6 to 13, the parts 3 of each body 1 at one of their ends have flanges 9 which partially bound one open face of the enclosure and, at the other of their ends, have flanges 22 of greater length than the flanges 9 which partially bound the other open face of the enclosure. Adjacent each flange 9 and integral with the inner surfaces of the end wall 2 and parts 3 are walls defining a socket 34 for reception of a separately formed pillar 35 of substantially H-shaped cross-section (FIGS. 11 and 12) which will engage in sockets 34 of, and be trapped between, the end walls 2 of the bodies 1. Each pillar 35 has throughout its length a flange 36 which has a plurality of apertures 37 mutually spaced along its length and which lies to one side of a plane containing the central axis of the pillar. In use, the pillars 35 are so engaged in the sockets 34 that the flanges 36 lie in substantially the same plane. The apertures 37 in the flanges 36 provide for a sub-rack or module to be detachably mounted in the enclosure. In one position of the pillars 35 within the sockets 34, the position of the apertured flanges 36 with respect to the adjacent open face of the enclosure is such that the front faces of sub-racks and/or modules detachably mounted on the flanges will be substantially flush with the open face of the enclosure. By inverting each pillar 35, the position of the apertured flanges 36 with respect to the adjacent open face of the enclosure will be such that the front faces of sub-racks and/or modules detachably mounted on the flanges will be set back from the open face of the enclosure.

Adjacent each flange 22 and integral with the inner surface of the end wall 2 are walls defining a socket 28 for reception of a flange on sub-rack or module. A sub-rack or module can be fitted in the enclosure when the enclosure is being assembled so that flanges on the sub-rack or module engage in the sockets 28 and the sub-rack or module is trapped between the end walls 2 of the bodies 1 and cannot be removed without dismantling the enclosure.

Figure 11:
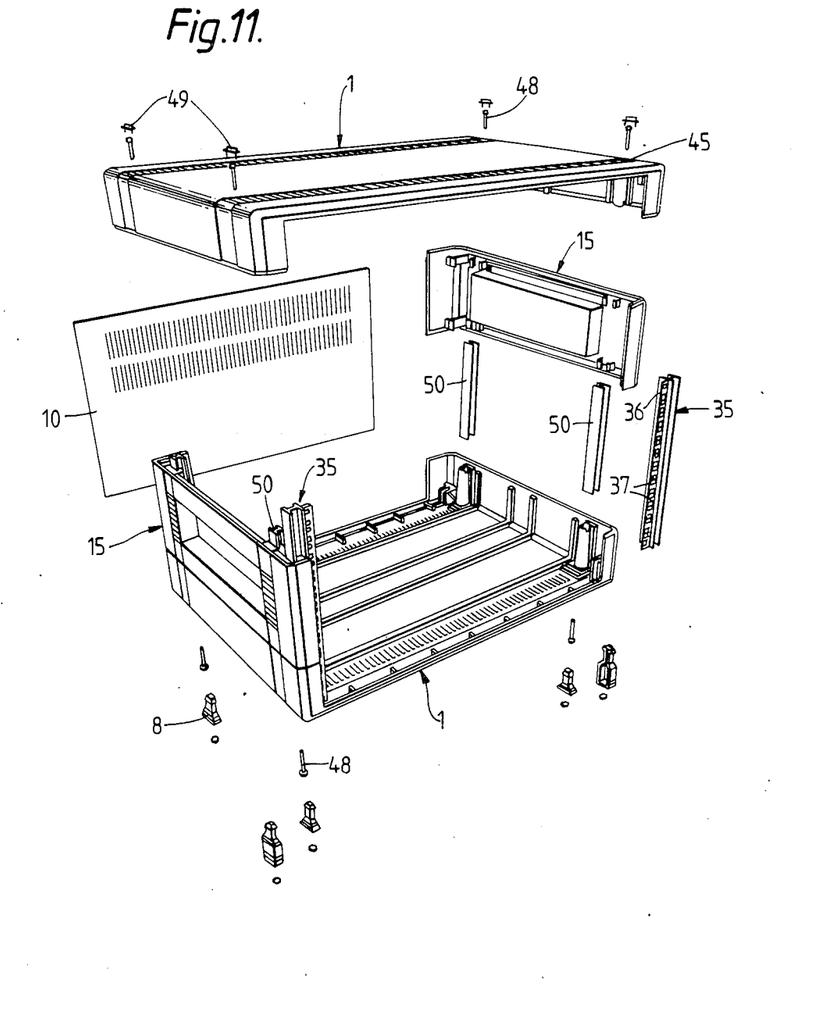
FIG. 11 is an exploded view of the enclosure shown in FIG. 5.
Figure 12:
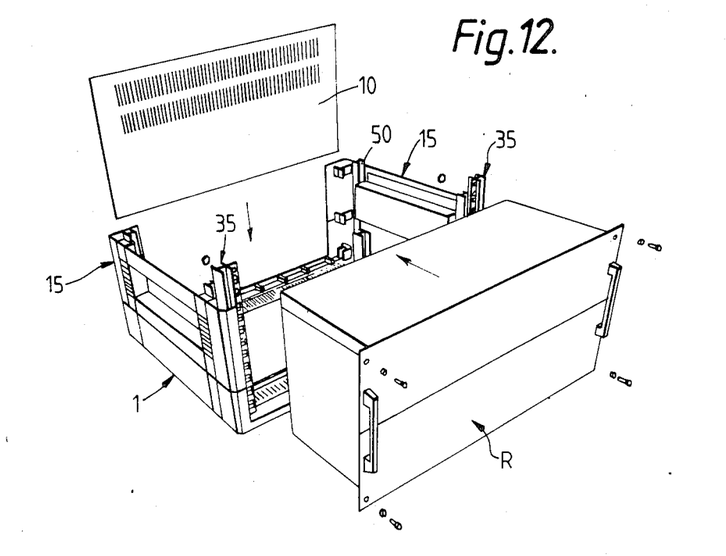
FIG. 12 is a fragmental exploded view of the enclosure shown in FIG. 5 illustrating how a sub-rack is detachably mounted in the enclosure.
Figure 13:
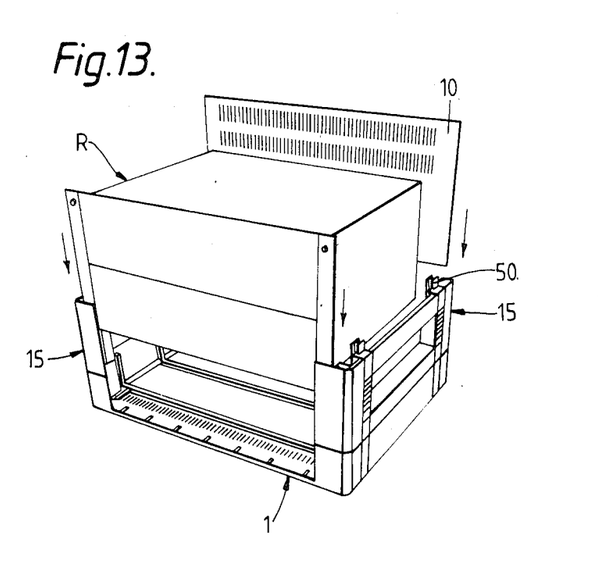
FIG. 13 is a fragmental exploded view of the enclosure shown in FIG. 5 illustrating how a sub-rack is trapped within the enclosure during assembly of the enclosure.
Figure 14:
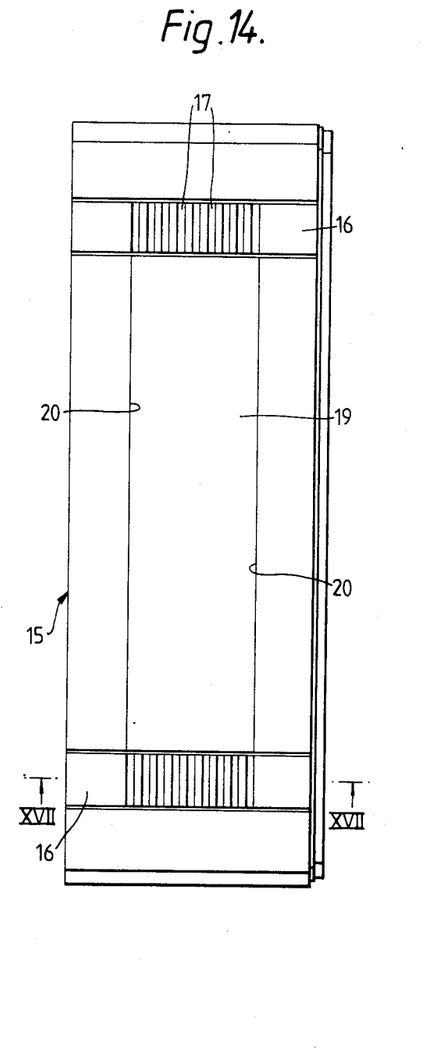
FIGS. 14 and 15 and 16, respectively, are outer and inner plan views and a side view of one of the infills employed in the enclosure shown in FIG. 5.
Figure 15:
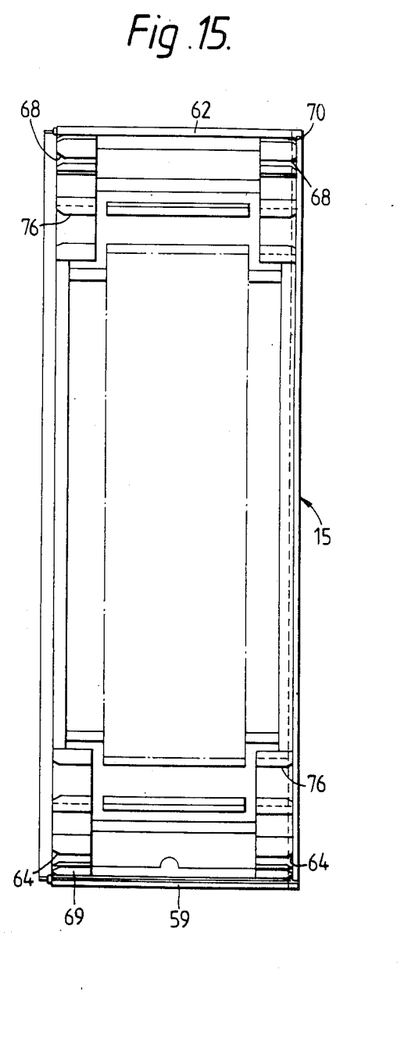
Figure 16:
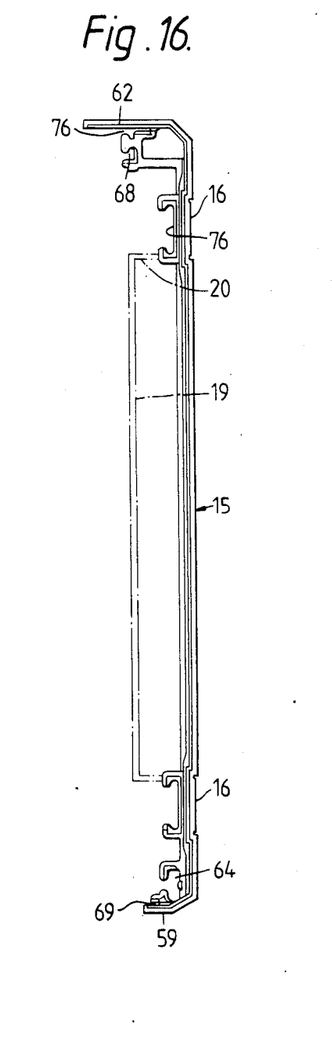
Figure 17:
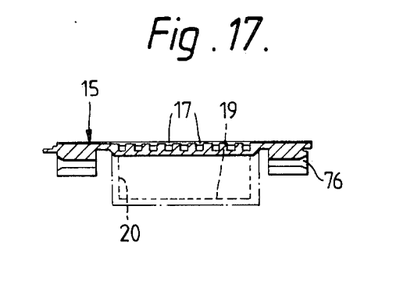
FIG. 17 is a sectional view taken on the line XVII—XVII in FIG. 14.

Depending on which open face of the enclosure is used as the front face of the enclosure, the other open face of the enclosure will be closed by a separately formed panel 10 (FIGS. 11 to 13). For this purpose, between the flanges 9 and a wall of each socket 34 are defined slots 29, and between the flanges 22 and a wall of each socket 28 are defined slots 30, the slots 29 and the slots 30 providing a means by which a separately formed panel 10 can be trapped between the bodies 1 to close that one of the open faces of the enclosure that is to be the rear face.

Between the sockets 34 and the sockets 28 of each body 1 adjacent the open faces of the enclosure are mutually spaced walls 31 integral with the inner surface of the end wall 2 which will abut an adjacent face of a sub-rack or module. When the front faces of sub-racks and/or modules are set back from the open face of the enclosure, the walls 31 also serve as means with which a separately formed trim (not shown) can frictionally engage to cover any exposed inner surface of the body 1.

To provide for detachable interconnection of two bodies 1 to form an enclosure, each body has adjacent each part 3, two posts 43 each having a throughbore 44 opening into a recess 45 in one of the grooves 6 in the outer face of the end wall 2. Each post 43 is spaced inwardly from the inner face of the adjacent part 3 and with the adjacent part 3 defines a socket 46. The open end of each post 43 remote from the end wall 2 is recessed at 47. When two bodies 1 are to be detachably secured together, a separately formed pillar 50 (FIGS. 11 to 13) of substantially H-shaped cross-section having a tapped hole in each of its ends is partially inserted into the recess 47 and associated socket 46 of each post 43 of one body 1 and is secured therein by a long screw 48 (FIGS. 11 to 13) which is inserted into the throughbore 44 of the post 43 from the recess 45 in the slot 6 and is screwed into the tapped hole at one end of the post. The protruding parts of the H-shaped pillars 40 engage in the recesses 47 and associated sockets 46 of the posts 43 of the other body 1 and are secured therein by long screws 48 which are inserted into the throughbores 44 of the post 43 of the other body and are screwed into the tapped holes at the other ends of the pillars.

It will be appreciated that the lengths of the pillars 40, and of the pillars 35, will depend upon whether or not one or more than one infill 15, 25 forms a part of each side wall of the enclosure.

Figure 10:
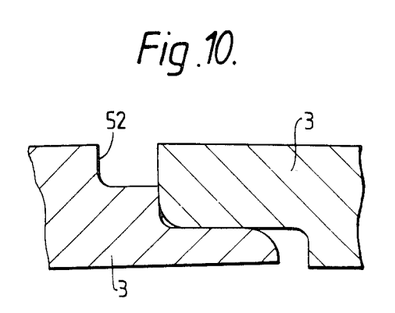
FIG. 10 is a fragmental sectional view, drawn on an enlarged scale, of one pair of interengaging edges of the separately formed bodies of the enclosures shown in FIGS. 1 to 5.

At their free edges, the parts 3 of each body 1 are stepped, as shown in FIG. 10, so that, when the two bodies 1 are detachably secured together, the stepped edges interengage as shown and form in the outer surface of the side wall of the enclosure a gap or groove 52 which will be pleasing to the eye.

Integral with the inner surface of the end wall 2 of each body 1 and extending between the parts 3 are strengthening ribs 54 in which are formed blind holes 55 for mounting of circuit boards directly on the body.

The long screws 48 used to secure the pillars 50 in the lower body 1 may also be used to secure feet 8 of a required height to the body, the feet engaging in the recesses 45. The recesses 45 in the outer surface of the end wall 2 of the upper body 1 may be closed by separately formed plugs 49 which are force fits in the recesses and whose outer surface may match the lands between the ventilation slots 7 in the grooves 6.

As will be seen in FIG. 12, a sub-rack R can be detachably mounted in the enclosure by means of bolts 51 which pass through apertures in flanges on the sub-racks and apertures 37 in the flanges 36 of the pillars 35. FIG. 13 illustrates how a sub-rack R can be trapped in an enclosure as the enclosure is assembled by means of flanges on the sub-rack which engage in the aligned sockets 28 of the bodies 1 and the sockets 68 of the infills 15.

Referring to FIGS. 14 to 17, the infill 15 of the enclosure shown in FIG. 5 has integral parts which correspond with and constitute extensions of parts of the bodies 1. At one of its ends the infill 15 has a flange 59 which is substantially identical to and will constitute an extension of the flanges 9 of each body part 1 and at the other of its ends the infill has a flange 62 which is substantially identical to and will constitute an extension of the flanges 22 of body parts 1. Adjacent the flange 59 are sockets 64 which, when the infill 15 is in use, will constitute extension of a part of the sockets 34 of the body parts 1 and adjacent the flange 62 are sockets 68 which, when the infill is in use, will constitute extension of the sockets 28 of the body parts 1. Between a wall of the socket 64 and the flange 59 are slots 69 which, when the infill 15 is in use, will constitute extension of the slots 29 and between a wall of the socket 68 and the flange 62 are slots 70 which, when the infill is in use, will constitute extension of the slots 30 of the bodies 1. Sockets 76 will, when the infill 15 is in use, constitute extensions of the sockets 46 of the body parts 1 for engagement by the H-shaped pillars 50. As previously explained, the infill 15 has an inset 19 which extends between the grooves 16 and which provides shoulders 20 which will constitute finger grips for lifting and carrying an enclosure of which the infill forms a part. The opposed longitudinal edges of the infills are stepped in a similar manner to the free edges of the parts 3 of each body 1 and interengage with the free edges of the parts 3 of two body parts in the same manner as shown in FIG. 10.

The improved enclosure of the present invention has the very important advantage that enclosures of a plurality of heights differing from one another can be assembled from two identical bodies constituting the end walls and a part of each of a pair of oppositely disposed side walls and an even number of infills, all of which infills may be identical to one another (infill 15) or an even number of which may be of one form (infill 12) and an even number of which may be of another form (infill 15). As a consequence, the cost of manufacture of enclosures of heights differing from one another is substantially reduced as compared with enclosures for housing circuit boards hitherto proposed and used. Furthermore, the preferred form of the improved enclosure has the additional important advantage that it provides alternative assembly facilities, in one of which sub-racks or card frames and/or modules are detachably mounted within the enclosure and so can be readily removed for servicing or testing and in the other of which sub-racks or card frames and/or modules are trapped between the end walls of the enclosure and cannot be removed without dismantling of the enclosure.

What we claim as our invention is:

1. An enclosure for housing sub-racks carrying circuit boards and modules carrying other electrical components, which enclosure comprises two separately formed substantially identical bodies, each of which constitutes an end wall and a part of each of a pair of oppositely disposed side walls and which are detachably secured together to form an enclosure having two oppositely disposed open faces, wherein, adjacent one of said two oppositely disposed open faces of the enclosure, the enclosure includes means on which sub-racks and modules can be detachably mounted in the enclosure in either of two positions, in one of which two positions front faces of the sub-racks and modules are substantially flush with said open face of the enclosure and in the other of which two positions said faces of the sub-racks and modules are set back from said open face of the enclosure.

2. An enclosure for housing sub-racks carrying circuit boards and modules carrying other electrical components, which enclosure comprises two separately formed substantially identical bodies, each of which constitutes an end wall and a part of each of a pair of oppositely disposed side walls and which are detachably secured together to form an enclosure having two oppositely disposed open faces, wherein, adjacent one of said two oppositely disposed open faces of the enclosure, the enclosure includes means on which sub-racks and modules can be detachably mounted in the enclosure in either of two positions, in one of which two positions front faces of the sub-racks and modules are substantially flush with said open face of the enclosure and in the other of which two positions said faces of the sub-racks and modules are set back from said open face of the enclosure, and wherein, adjacent the other of said oppositely disposed open faces, inner parts of the end walls of said bodies are so shaped that sub-racks and modules can be trapped in the enclosure between said inner parts of said end walls of the bodies when the enclosure is assembled.

3. An enclosure as claimed in claim 2, wherein said inner parts of the end walls of said bodies define slots in which flanges of sub-racks and modules can engage.

4. An enclosure as claimed in claim 1, wherein the means on which sub-racks and modules can be detachably mounted in the enclosure comprise a pair of pillars which detachably engage in slots in inner parts of the end walls of the bodies and which are trapped therebetween, each of which pillars has throughout substantially the whole of its length a flange which has a plurality of apertures mutually spaced throughout its length and which lies to one side of a plane containing the central axis of the pillar, the flange of one pillar extending towards and lying in substantially the same plane as the flange of the other pillar.

5. An enclosure as claimed in claim 1, wherein each of said oppositely disposed side walls of the enclosure has secured between the parts of said side wall integral with the bodies at least one separately formed infill, oppositely disposed infills of said oppositely disposed side walls being substantially identical the one with the other.

6. An enclosure as claimed in claim 1, wherein each of said oppositely disposed side walls of the enclosure has secured in alignment between the parts of said side wall integral with the bodies at least two separately formed infills, all of the separately formed infills of said oppositely disposed side walls being substantially identical with one another.

7. An enclosure as claimed in claim 1, wherein each of said oppositely disposed side walls of the enclosure has secured in alignment between the parts of said side wall integral with the bodies at least two separately formed infills, the separately formed infills of said side wall being of at least two forms differing from one another, and oppositely disposed infills of said oppositely disposed side walls being substantially identical the one with the other.

8. An enclosure as claimed in claim 5, wherein at least one infill of each oppositely disposed side wall has in its outer surface an inset or such a shape and form as to constitute a finger grip for facilitating lifting and carrying of the enclosure.

9. An enclosure as claimed in claim 1, wherein the bodies of the enclosure, and when present the infills, are of moulded plastics material.

10. An enclosure as claimed in claim 1, wherein the rear face of the enclosure is closed by a separately formed plate trapped between the end and side walls of the enclosure.

11. An enclosure as claimed in claim 1, wherein each body constituting an end wall and parts of said oppositely disposed side walls of the enclosure has ventilation apertures in the end wall.

12. An enclosure as claimed in claim 1, wherein each body constituting an end wall and parts of said oppositely disposed side walls of the enclosure has ventilation apertures in at least one groove in the outer surface of the end wall of the body.

13. An enclosure as claimed in claim 12, wherein the or each groove having ventilation apertures in the outer surface of that wall of the enclosure which will be uppermost when the enclosure is in use is temporarily closed by a separately formed strip which fits in the groove.

14. An enclosure as claimed in claim 13 in which the length of the oppositely disposed side walls of the enclosure is increased by the incorporation of at least one infill, wherein the infill also has ventilation apertures.

15. An enclosure as claimed in claim 14, wherein the ventilation apertures in the infill are formed in at least one groove in the outer surface of the infill, which groove is a continuation of the groove in the outer surface of the bodies.

16. An enclosure as claimed in claim 1, wherein separately formed feet are detachably secured to one of the bodies so that, when the enclosure is supported on these feet, the other of the bodies will be uppermost.

17. An enclosure as claimed in claim 1, wherein two separately formed feet are detachably secured to each of the bodies so that, when the enclosure is supported on these feet, the end walls constituted by these bodies will be substantially vertically disposed.

* * * * *